United States Patent
Wang et al.

(10) Patent No.: US 9,915,943 B2
(45) Date of Patent: *Mar. 13, 2018

(54) SYSTEM AND METHOD OF MONITORING AN ENVIRONMENTAL PARAMETER ALONG A PREDETERMINED ROUTE

(71) Applicant: TAIWAN SEMICONDUCTOR MANUFACTURING COMPANY, LTD., Hsinchu (TW)

(72) Inventors: Wei-Cheng Wang, Jongli (TW); Hsiang Yin Shen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 643 days.

This patent is subject to a terminal disclaimer.

(21) Appl. No.: 14/271,895

(22) Filed: May 7, 2014

(65) Prior Publication Data

US 2014/0244021 A1 Aug. 28, 2014

Related U.S. Application Data

(63) Continuation of application No. 12/846,509, filed on Jul. 29, 2010, now Pat. No. 8,751,045.

(51) Int. Cl.
*G05B 19/418* (2006.01)
*H01L 21/67* (2006.01)
*H01L 21/677* (2006.01)

(52) U.S. Cl.
CPC .... *G05B 19/4189* (2013.01); *H01L 21/67253* (2013.01); *H01L 21/67294* (2013.01); *H01L 21/67733* (2013.01); *Y02P 90/18* (2015.11); *Y02P 90/28* (2015.11)

(58) Field of Classification Search
CPC combination set(s) only.
See application file for complete search history.

(56) References Cited

U.S. PATENT DOCUMENTS

| | | |
|---|---|---|
| 6,908,066 B2 | 6/2005 | Koenig |
| 7,477,963 B2 | 1/2009 | Hori et al. |
| 8,175,748 B2 | 5/2012 | Matsumoto et al. |

(Continued)

FOREIGN PATENT DOCUMENTS

WO 2010057623 5/2010

*Primary Examiner* — Thomas G Black
*Assistant Examiner* — Ana D Thomas
(74) *Attorney, Agent, or Firm* — Hauptman Ham, LLP (57) ABSTRACT

A monitoring system has a vehicle and a monitoring device. The vehicle is movable along a predetermined route, and the monitoring device is mounted to the vehicle. The monitoring device has a sensor configured to monitor an environmental parameter and a controller communicatively coupled to the sensor. The controller is configured to record the monitored environmental parameter along the predetermined route as data points associated with time tags, record position information, and associate the position information with corresponding time tags. The number of time tags associated with the position information is less than the number of time tags associated with the monitored environmental parameter. A server is configured to receive and display a visualized presentation of the recorded monitored environmental parameter and the recorded position information.

20 Claims, 8 Drawing Sheets

(56) References Cited

U.S. PATENT DOCUMENTS

| | | |
|---|---|---|
| 2005/0096776 A1 | 5/2005 | Beaulieu et al. |
| 2006/0049249 A1* | 3/2006 | Sullivan ............... G06K 7/0008 235/385 |
| 2006/0099959 A1* | 5/2006 | Staton ..................... B60R 25/00 455/456.1 |
| 2006/0220817 A1* | 10/2006 | Schofield ............ B60C 23/0401 340/447 |
| 2008/0228310 A1 | 9/2008 | Wang et al. |
| 2010/0030417 A1 | 2/2010 | Fang et al. |
| 2010/0063625 A1* | 3/2010 | Krause ............... G05B 19/4182 700/245 |
| 2010/0127133 A1 | 5/2010 | Schrevere et al. |
| 2011/0094546 A1 | 4/2011 | Valcore et al. |
| 2011/0231039 A1* | 9/2011 | Leitel ................... B60T 8/1893 701/19 |

\* cited by examiner

SYSTEM AND METHOD OF MONITORING AN ENVIRONMENTAL PARAMETER ALONG A PREDETERMINED ROUTE

PRIORITY CLAIM

The present application is a continuation of U.S. application Ser. No. 12/846,509, filed Jul. 29, 2010, which is incorporated herein by reference in its entirety.

TECHNICAL FIELD

The present disclosure relates to semiconductor manufacturing, and more particularly, to a system and method of monitoring an environmental parameter along a predetermined route.

BACKGROUND

During manufacturing of semiconductor integrated circuits (ICs), semiconductor wafers are subjected to multiple processing steps at different processing equipments. For example, to complete the fabrication of an IC chip, various steps of deposition, cleaning, ion implantation, etching, and/or passivation steps are generally carried out in different processing equipments. Therefore, fabrication facilities generally include transportation systems such as an automated material handling system (AMHS) for transporting the semiconductor wafers among the processing equipments.

Further, in a fabrication facility, a carefully controlled environment when transporting the semiconductor wafers is important due to the delicate nature of the chips. Abnormalities in vibration, temperature, humidity, or level of contamination along the route of transportation increase the risk of unexpected particles or features formed on the wafers and decrease the yield rate of the manufacturing process. Therefore, there is a need for monitoring one or more environmental parameters when transporting the semiconductor wafers.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1A:
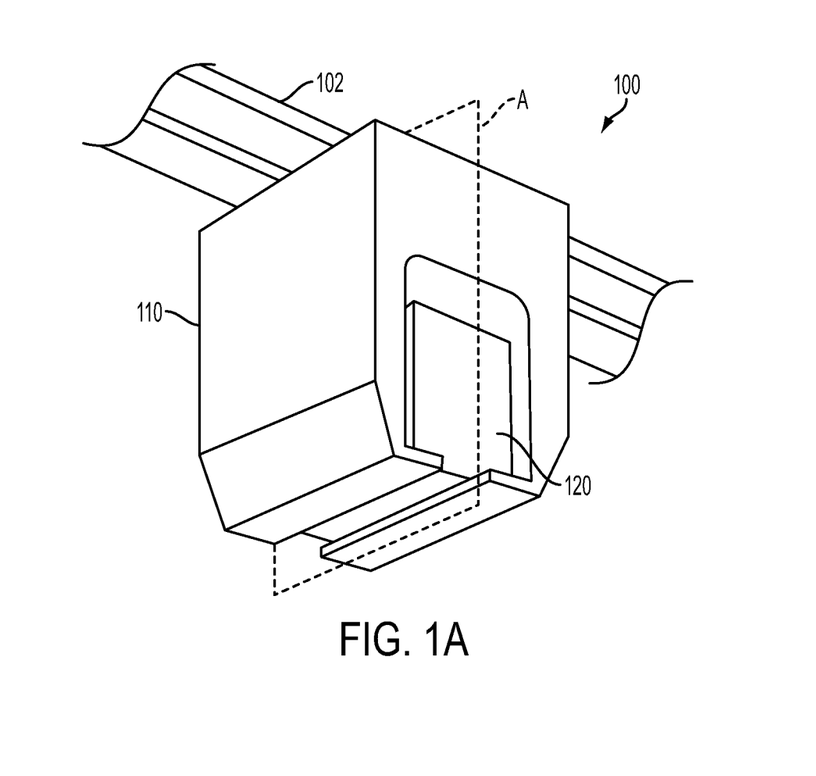
FIG. 1A is a perspective view of a portion of a monitoring system according to an embodiment.

FIG. 1A depicts a portion of a monitoring system 100 for monitoring an environmental parameter along a predetermined route according to an embodiment. A track 102 is positioned to define the predetermined route along which the monitoring system 100 is movable. The monitoring system 100 comprises a vehicle 110 configured to move along track 102 and a monitoring device 120 detachably mounted to vehicle 110 and configured to monitor an environmental parameter. In some embodiments, the monitoring system 100 is an AMHS adapted to perform the monitoring function. In some embodiments, the monitoring system 100 monitors one or more environmental parameters including vibration, temperature, humidity, or level of contamination along the route of transportation, or any combination thereof.

Figure 1B:
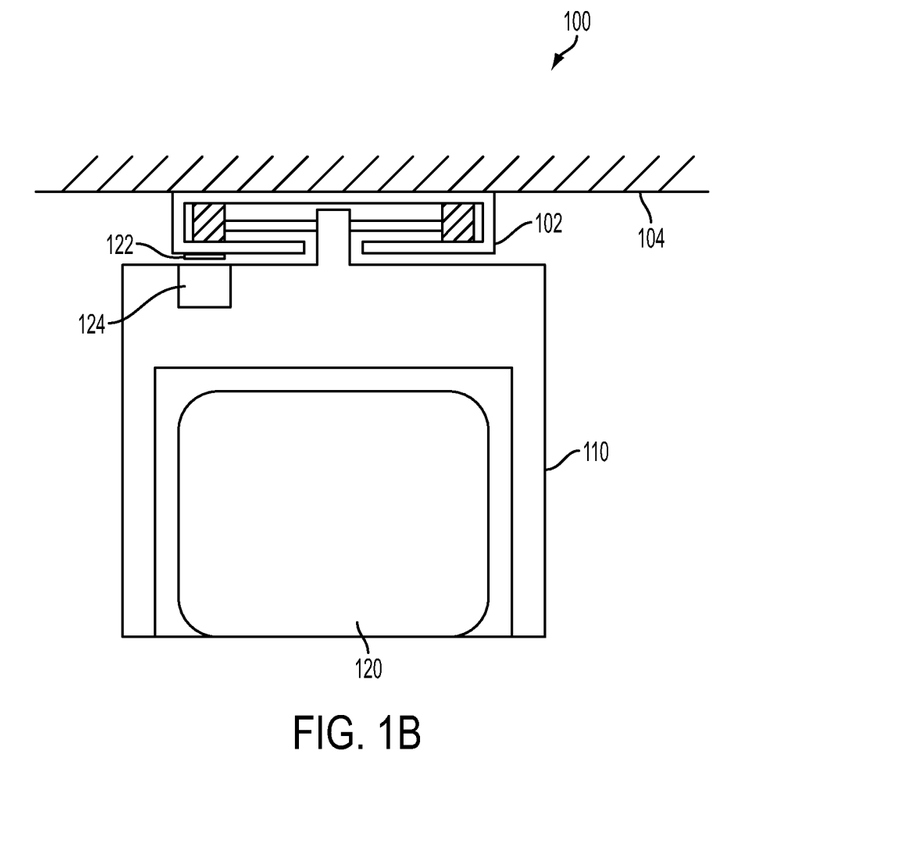
FIG. 1B is a cross-sectional view of the monitoring system depicted in FIG. 1A.

FIG. 1B is a cross-sectional view as seen if looking at (imaginary) plane A of the monitoring system 100 depicted in FIG. 1A. In at least one embodiment, track 102 is a guide rail mounted to a ceiling 104 in a fabrication facility, and vehicle 110 is movably mounted to the guide rail. In some other embodiments, track 102 comprises a rail, a magnetic strip, a conveyor, or a combination thereof. Depending on the type of track and vehicle, in some embodiments, the track is mounted on a floor or an elevated structure. Vehicle 110 is configured to carry a payload and move along the track. The payload, in some exemplary applications, comprises a Front Opening Unified Pod (FOUP) designed to hold one or more semiconductor wafers. In at least one embodiment, the payload is monitoring device 120.

Further, a positioning tag 122 is positioned at a predetermined position along the predetermined route and vehicle 110 comprises a photonic device 124 configured to read position information from positioning tag 122 according to detection of positioning tag 122. In some embodiment, positioning tag 122 is positioned on or adjacent to the track 102. In at least one embodiment, positioning tag 122 comprises a barcode and the photonic device 124 is a barcode reader for detecting the barcode on the positioning tag 122. In some other embodiments, positioning tag 122 comprises an optical feature such as a barcode, a text, a figure, or a combination thereof and photonic device 124 is configured to be responsive to all or a portion of visible lights, infrared lights, or ultraviolet lights, or any combination thereof, that it received either directly from a light source or by reflection.

Figure 2:
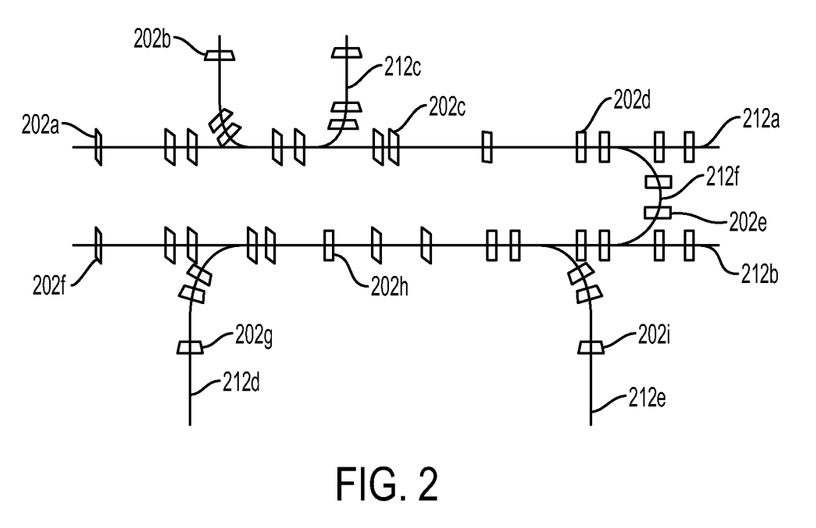
FIG. 2 is a diagram of exemplary predetermined routes and positioning tags according to an embodiment.

FIG. 2 depicts an exemplary layout of predetermined routes and positioning tags according to an embodiment. A plurality of positioning tags 202a through 202i similar to the positioning tag 122 (FIG. 1B) are positioned at a plurality of predetermined positions along the routes or tracks 212a through 212f. In some embodiments, the position information acquired by the vehicle 110 is sent to a traffic control center for controlling the traffic on the tracks, i.e., the movement of at least one vehicle 110 on the tracks. For example, at a specific time in at least one embodiment, there is more than one vehicle 110 mounted on and mobile along the tracks 212a-212f in order to transport semiconductor wafers to different processing equipment in the fabrication facility. The traffic control center directs vehicles to a corresponding destination processing equipment while avoiding collisions between the vehicles. Further, in order to monitor an environmental parameter in the fabrication facility along the tracks 212a-212f, at least one vehicle 110 carries a monitoring device 120 instead of one or more FOUPs holding semiconductor wafers or other payload types. In some embodiments, the vehicle 110 with the monitoring device 120 moves along a predetermined route for monitoring the environmental parameter along the predetermined route.

In some embodiments, on top of the positioning tags 202a-202i necessary for traffic control, more positioning tags are placed along the tracks 212a-212f at sections where higher spatial resolution for monitoring the environmental parameter is preferred. For example, in an embodiment in which the vibration of the vehicle 110 along the tracks 212a-212f is monitored, more positioning tags are positioned at positions where track assemblies are jointed, where there is a track junction, or where there is a curved track.

Figure 3:
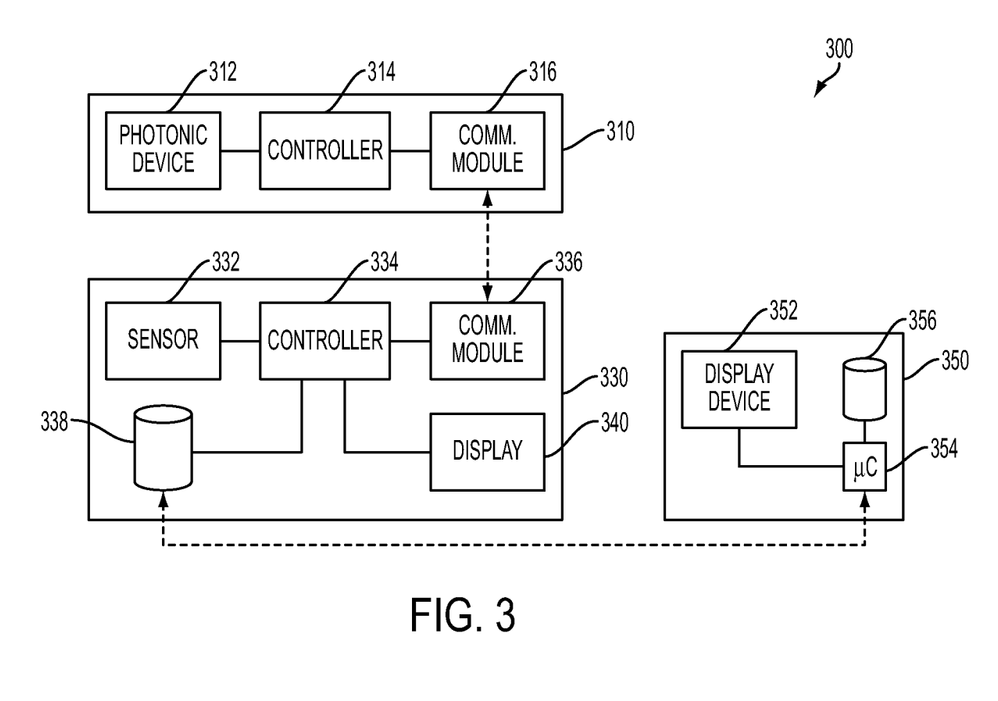
FIG. 3 is a system diagram of the monitoring system for monitoring an environmental parameter along a predetermined route according to an embodiment.

FIG. 3 depicts a system diagram of a monitoring system 300 for monitoring an environmental parameter along a predetermined route according to an embodiment. Similar to the monitoring system 100 (FIGS. 1A and 1B), the monitoring system 300 comprises a vehicle 310 configured to move along the predetermined route and a monitoring device 330 detachably mounted to the vehicle 310. In addition, in at least one embodiment, the monitoring system 300 further comprises a log server 350 configured to receive the recorded monitored environmental parameter and the recorded position information from the monitoring device 330. The log server 350 comprises a display device 352 configured to display a visualized presentation of the predetermined route, the recorded monitored environmental parameter, and/or the recorded position information. In some embodiments, the log server 350 further comprises a microcontroller 354 electrically coupled to the display device 352 to control the operation of the display device 352 and a storage 356 electrically coupled to the microcontroller 354 to store the recorded monitored environmental parameter received from the monitoring device 330.

The vehicle 310 is configured to transport the monitoring device 330 and move along the predetermined route, such as a track 102 (FIG. 1B). In some embodiments, vehicle 310 comprises a photonic device 312, a controller 314 communicatively coupled to the photonic device 312, and a communication module 316 communicatively coupled to the photonic device 312 and the controller 314. The photonic device 312 reads position information according to detection of a positioning tag positioned at a predetermined position along the route or track. The communication module 316 transmits the position information to the monitoring device 330.

In at least one embodiment, the controller 314 manages the operation of the photonic device 312 and the communication module 316. Further, in some embodiments, the controller 314 also controls a motor of the vehicle 310 in order to drive the vehicle 310 along the route or track based on a predetermined traffic control functionality programmed in a storage device of the vehicle 310 or instructions issued by a traffic control center to the vehicle 310.

In at least one embodiment, the monitoring device 330 comprises a sensor 332, a controller 334, a storage device 338, and a display 340. The controller 334 is communicatively coupled to the sensor 332, the storage device 338, and the display 340 to manage the operation of the monitoring device 330. In some embodiments, the controller 334 comprises a general-purpose microcontroller, a processor, or an application-specific integrated circuit (ASIC) and the storage device 338 comprises a hard drive, a flash drive, a DRAM, an SRAM, or an applicable storage device such as a computer readable medium storing instructions for execution by the controller 334.

The sensor 332 monitors the environmental parameter. In at least one embodiment, the sensor 332 is a vibration sensor for monitoring a vibration along the route or track of the vehicle 310 to which the monitoring device 330 is attached. For example, in some embodiments, the sensor 332 is a tri-axial vibration sensing device. The tri-axial vibration sensing device continuously, or repetitively according to a preset timing pattern, monitors vibrations and decomposes them into x-axis, y-axis, and z-axis components. In some embodiments, the sensor 332 is a vibration sensing device capable of recording vibrations according to less or more than three axes. In some other embodiments, the sensor 332 is configured to detect vibration, temperature, humidity, contamination levels in the air, noise, bio-hazardous particles, or any combination thereof. In at least one embodiment, the sensor 332 is a camera configured to acquire still images or video clips.

In some embodiments, the controller 334 records the monitored environmental parameter and stores the parameter in the storage device 338. For example, the controller 334 receives the vibration information from the sensor 332 and records the vibration information in a time-based manner with a plurality of time tags along a time axis. In some embodiments, each stored vibration data point is associated with a time tag. Further, in some embodiments, the controller 334 is communicatively coupled with the photonic device 312 through communication module 336. In some embodiments, the controller 334 receives the position information from the vehicle 310 and stores the position information in the storage device 338. In at least one embodiment, while recording the monitored environmental parameter and the position information, the controller 334 also associates the position information with at least one of the plurality of time tags.

The communication module 336 of monitoring device 330 communicates with the communication module 316 of vehicle 310. In some embodiments, communication modules 316 and 336 are coupled in a wired manner. For example, when mounting the monitoring device 330 onto the vehicle 310, as depicted in FIG. 1B, the communication modules 316 and 336 are electrically coupled through a USB connection, an IEEE-1394 connection, a RS-232 connection, an optical fiber, or another applicable connection, either serial or parallel. In some embodiments, communication module 316 is electrically connected to a set of connecting pins, and communication module 336 is electrically connected to a set of connecting pads, where the connecting pins and corresponding connecting pads form electrical contacts with each other when the monitoring device 330 is mounted onto the vehicle 310.

In yet some other embodiments, the communication modules 316 and 336 are communicatively coupled in a wireless manner. For example, in at least one embodiment, the communication module 316 and the communication module 336 are BLUETOOTH communication modules capable of communicating with each other according to a BLUETOOTH communication protocol. In some embodiments, the communication module 316 and the communication module 336 are wireless LAN modules, infrared communication modules, laser transceivers, or any applicable wireless communication modules according to industry protocols or proprietary protocols.

In some embodiments, a log server 350 comprising a display device 352 configured to communicate with the monitoring device 330 in order to receive the recorded monitored environmental parameter and the recorded position information. In at least one embodiment, the monitoring device 330 is removed from the vehicle 310 after being transported along a predetermined route by the vehicle 310, and then the log server 350 is communicatively coupled to the monitoring device 330 in a wired or wireless manner, such as the exemplary communication methods presented above for communication modules 316 and 336. In at least another embodiment, the log server 350 is communicatively coupled to the monitoring device 330 in a wireless manner and receives the recorded monitored environmental parameter and position information while the monitoring device 330 remains mounted to and transported by the vehicle 310.

The display device 352 displays the visualized presentation of the monitoring results received from the monitoring device 330. In some embodiments, the display device 352 is an LCD monitor. Further, in at least one embodiment, the monitoring device 330 also comprises a display device 340 for showing the operational status of the monitoring device 330 and/or the readings of the monitored environmental parameter. In some embodiments, the display device 340 also displays the visualized presentation of the monitoring results of the monitoring device 330. In at least some embodiments, the display device 340 is an LCD monitor or an LED array.

Figure 4:
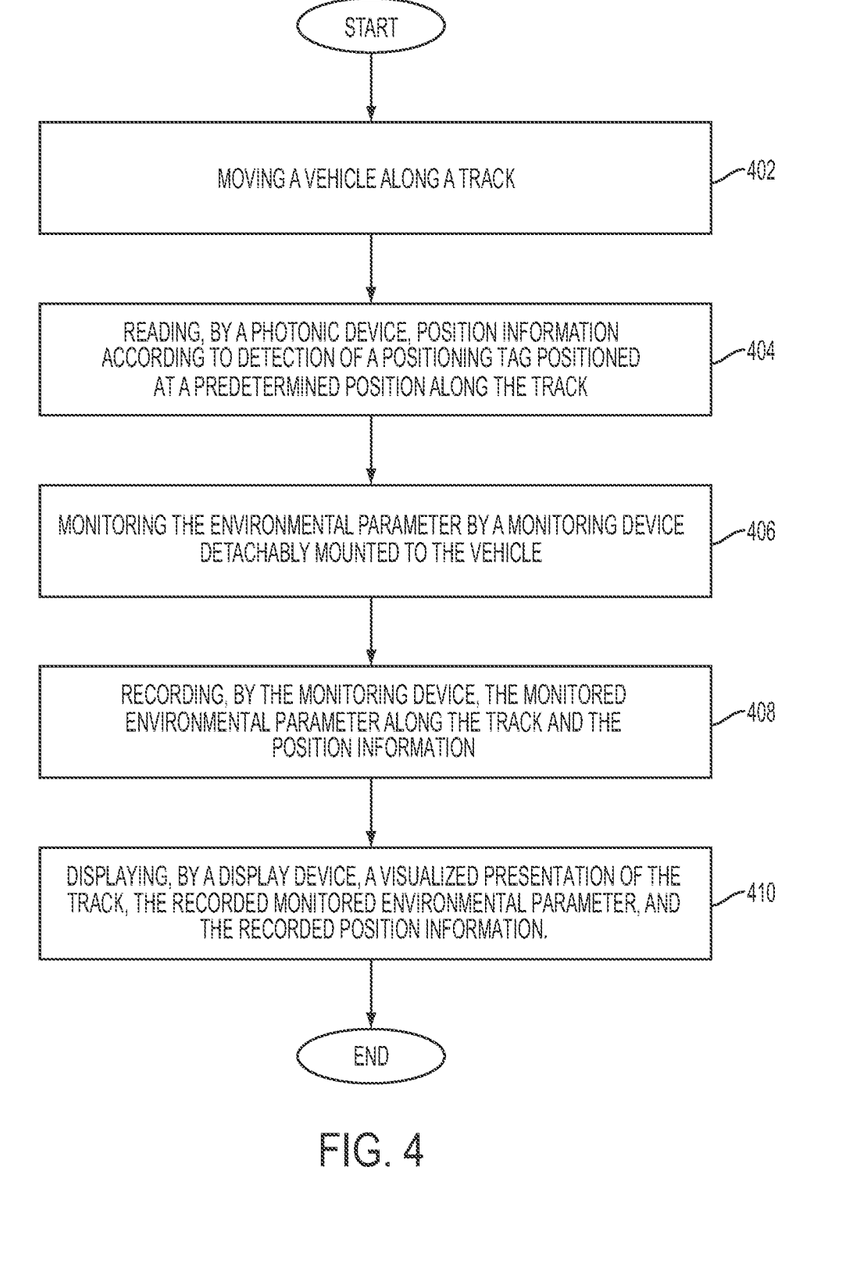
FIG. 4 is a flow chart of a process for monitoring an environmental parameter according to an embodiment.

FIG. 4 is a flow chart of a process for monitoring an environmental parameter according to an embodiment. The flow chart is merely exemplary, and additional functions may be performed before, after, or in between the exemplary steps. Further, in some embodiments, the exemplary functionality is performed in a different order.

In step 402, a vehicle 310 carrying a monitoring device 330 is driven along a predetermined route for monitoring an environmental parameter. In Step 404, position information is read from a positioning tag by a photonic device 312 according to detection and/or scanning of the positioning tag positioned at a predetermined position along the predetermined route. In step 406, the environmental parameter is monitored by a monitoring device 330 detachably mounted to the vehicle. In some embodiments, the monitoring device 330 is configured to detect vibration, temperature, humidity, contamination levels in the air, noise, bio-hazardous particles, or any combination thereof. In at least one embodiment, the monitoring device 330 is configured to acquire still images or video clips.

In step 408, the monitored environmental parameter and the position information are recorded by the monitoring device 330 along the predetermined route. In some embodiments, monitoring device 330 records the vibration in a time-based manner with a plurality of time tags and associates the position information with at least one of the plurality of time tags.

In step 410, a display device 340 or 352 displays a visualized presentation of the predetermined route, the recorded monitored environmental parameter, and/or the recorded position information is shown by.

Figure 5A:
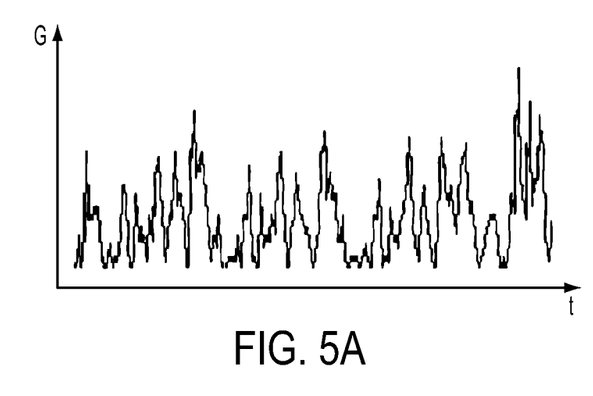
FIG. 5A is a chart of a recorded environmental parameter according to an embodiment.

FIG. 5A is a chart of a recorded environmental parameter versus a time axis according to an embodiment. In some embodiments, when the monitoring device 330 starts to record the monitored environmental parameter, the monitored results are recorded in a time-based manner. In at least some embodiments, each monitored result is associated with a time tag generated by the monitoring device 330. For example, in at least one embodiment, a vibration of the vehicle 330 is monitored by the monitoring device 330. The monitoring device 330 continuously monitors the vibration and associates the results with time tags. Therefore, the relation between recorded monitored vibration versus a time axis is depicted in FIG. 5A. However, in some applications, because more than one vehicle may move along the tracks or routes at the same time, the vehicle 310 carrying the monitoring device 330 is ordered by the traffic control center to stop, speed up, or slow down from time to time. That is, the vehicle 310 does not necessarily travel at a constant speed. Thus, merely from the information depicted in FIG. 5A, the spatial relationship between the recorded monitored environmental parameter and its corresponding positions along the predetermined route cannot be properly determined.

Figure 5B:
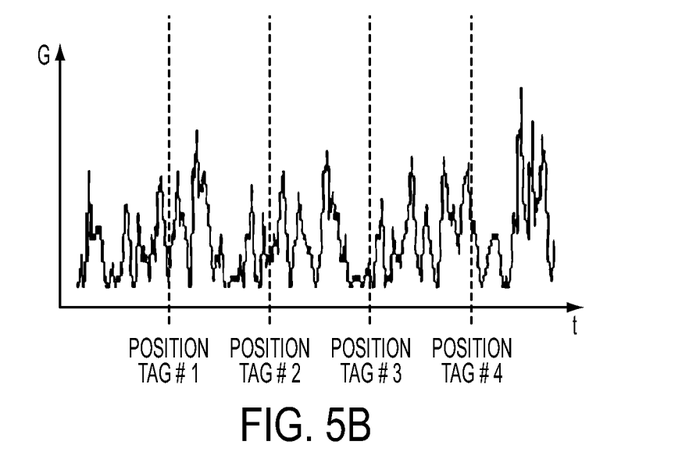
FIG. 5B is a chart of the recorded environmental parameter and overlaid recorded position information according to an embodiment.

FIG. 5B is a chart of a recorded environmental parameter versus a time axis in combination with recorded position information associated with a plurality of time tags according to an embodiment. In some embodiments, the monitoring device 330 also receives position information from the vehicle and associates the received position information with time tags. In some embodiments, the read position information is translated into a text code for recording. As such, the spatial relationship between the recorded monitored environmental parameter and the corresponding positions along the predetermined route are determinable from the recorded monitored environmental parameter and the position information (such as the Position Tags #1-#4 depicted in FIG. 5B).

Figure 6:
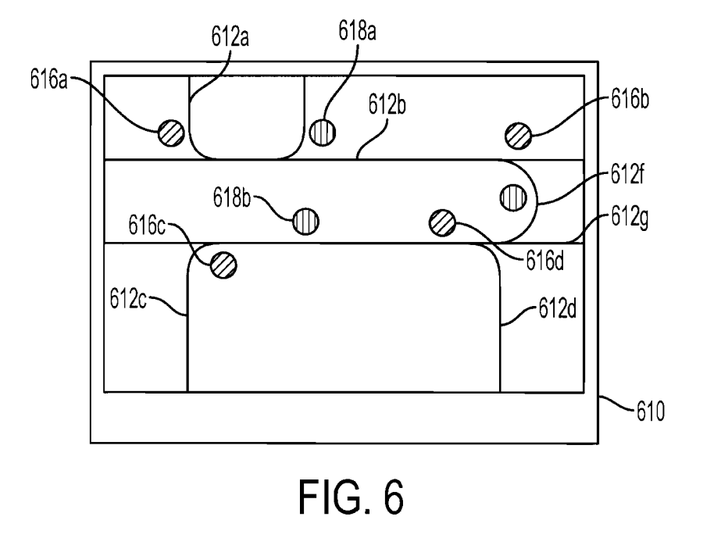
FIG. 6 is a diagram of an exemplary visualized presentation of predetermined routes with dots depicted to identify positions of abnormality.

FIG. 6 is a diagram of an exemplary visualized presentation of predetermined routes with dots depicted to identify positions of abnormality. In order to better identify the positions along the predetermined route where abnormality is suggested by the monitored environmental parameter and thus further actions may be necessary, the display device 610 displays a visualization of the recorded monitored environmental parameter. In at least one embodiment, the display of visualized presentation of the monitoring results is performed by the log server 350 executing a program or a set of instructions stored in a storage device 356 of the log server 350.

In some embodiments, a layout of the predetermined route as well as other possible routes, such as tracks 612a-612g, is depicted on the display device 610. At least one data point in the recorded monitored environmental parameter that will be identified in the visualized presentation is selected. For example, if the monitored environmental parameter is vibration of monitoring device 330 while mounted to the vehicle 310, a data point in the recorded monitored environmental parameter having a vibration value greater than a predetermined threshold (such as 0.5 G for example) can be selected as a selected data point associated with a location of an abnormal occurrence.

Further, a position on the layout of the predetermined route can be selected according to the recorded position information and the selected data point. Numerical calculations, such as an interpolation or an extrapolation to determine a position corresponding to the selected data point, are performed in order to more accurately determine the position. Then, the position corresponding to the location of abnormal occurrence is identified on the layout of the predetermined route displayed on the display device 610. Based on the visualized presentation, further acts can be taken to cure the identified abnormality. For example, if the vibration at a specific position along a track exceeds the predetermined threshold, a nearby track assembly, track joint or track junction is examined, adjusted, or replaced, to ease the vibration.

In some embodiments, the recorded monitored environmental parameter is screened by two or more threshold values. For example, when monitoring the vibration of the vehicle along the predetermined route, a first group of data points having values greater than 0.5 G and a second group of data points having values greater than 0.4 G, but no greater than 0.5 G, are selected. Subsequently, the positions on the depicted layout of the tracks 612a-612g are determined, and these positions are identified on the display device 610 with predetermined symbols 616a-616d and 618a-618b. In at least one embodiment, positions corresponding to the first group of data points are depicted with red dots such as dots 616a-616d, and positions corresponding to the second group of data points are depicted with yellow dots such as dots 618a-618b. In some embodiments, instead of colored dots, the positions corresponding to the first and second groups of data points are depicted by dots with shading or patterns, colored segments, or arrows pointing to corresponding positions on the layout of tracks 612a-612g.

According to some embodiments, a monitoring system for a wafer handling system includes a monitoring device mounted to a vehicle movable along a predetermined route, the monitoring device comprising a sensor configured to monitor an environmental parameter, and a controller communicatively coupled to the sensor. The controller is configured to record the monitored environmental parameter along the predetermined route as a plurality of data points, each data point of the plurality of data points associated with a time tag of a plurality of time tags, record position information, and associate the position information with corresponding one or more time tags of the plurality of time tags, wherein a number of time tags associated with the position information is less than a number of time tags associated with the monitored environmental parameter. The system also includes a server configured to receive the recorded monitored environmental parameter and the recorded position information from the monitoring device and display a visualized presentation of the recorded monitored environmental parameter and the recorded position information.

According to some embodiments, a method of monitoring an environmental parameter includes moving a vehicle along a predetermined route, reading position information at a plurality of predetermined positions along the predetermined route, monitoring an environmental parameter by a monitoring device mounted to the vehicle, and recording the monitored environmental parameter along the predetermined route as a plurality of data points, associating each data point of the plurality of data points with a time tag of a plurality of time tags, and associating the position information with corresponding one or more time tags of the plurality of time tags. A number of time tags associated with the position information is less than a number of time tags associated with the monitored environmental parameter. The method also includes recording the position information and displaying a visualized presentation of the recorded monitored environmental parameter and the recorded position information.

According to some embodiments, an Automated Material Handling System (AMHS) includes a track, a monitoring device, and a vehicle configured to carry the monitoring device and move along the track. The vehicle includes a detection device configured to read position information along the track and a communication module communicatively coupled to the detection device and configured to transmit the position information to the monitoring device. The monitoring device includes a controller communicatively coupled to the communication module of the vehicle, the controller being configured to record the position information and generate a visualized presentation of the track and at least one abnormal occurrence identifier associated with the recorded position information.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A monitoring system comprising:
a monitoring device mounted to a vehicle movable along a track, the monitoring device comprising:
a sensor configured to monitor an environmental parameter; and
a controller communicatively coupled to the sensor, the controller being configured to:
record the monitored environmental parameter along the track as a plurality of data points, each data point of the plurality of data points being associated with a corresponding time tag of a plurality of time tags; and
record position information and associate the position information with corresponding one or more time tags of the plurality of time tags, wherein a number of time tags associated with the position information is less than a number of time tags associated with the monitored environmental parameter; and
a server configured to:
receive the recorded monitored environmental parameter and the recorded position information from the monitoring device; and
display a visualized presentation of the recorded monitored environmental parameter and the recorded position information, wherein the visualized presentation of the recorded position information is based on a predetermined position of a positioning tag located on or adjacent to the track.

2. The monitoring system of claim 1, wherein the monitoring device further comprises a detection device configured to detect the positioning tag positioned at the predetermined position along the track.

3. The monitoring system of claim 2, wherein:
the positioning tag is one positioning tag of a plurality of positioning tags;
the predetermined position along the track is one predetermined position of a plurality of predetermined positions along the track;
each positioning tag of the plurality of positioning tags is associated with a corresponding predetermined position of the plurality of predetermined positions along the track; and
the plurality of predetermined positions along the track comprises high spatial resolution areas.

4. The monitoring system of claim 2, wherein the vehicle comprises a first communication module communicatively coupled to the detection device, and the monitoring device further comprises a second communication module communicatively coupled to the controller and configured to communicate with the first communication module.

5. The monitoring system of claim 4, wherein at least one of the first communication module or the second communication module is a wireless communication module.

6. The monitoring system of claim 1, wherein the monitored environmental parameter is one or more of vibration, temperature, humidity, a contamination level, noise, or a bio-hazardous particle level.

7. The monitoring system of claim 1, wherein the sensor is a camera configured to acquire a still image or a video clip.

8. The monitoring system of claim 1, wherein the server is further configured to display a visualized presentation of the track.

9. The monitoring system of claim 1, wherein the server is further configured to filter the recorded monitored environmental parameter by a first threshold value.

10. The monitoring system of claim 9, wherein the server is further configured to display an abnormal occurrence identifier associated with the first threshold value.

11. The monitoring system of claim 10, wherein the server is further configured to display the abnormal occurrence identifier based on the recorded position information.

12. The monitoring system of claim 9, wherein the server is further configured to filter the recorded monitored environmental parameter by a second threshold value and display an abnormal occurrence identifier associated with the second threshold value.

13. A method of monitoring an environmental parameter, comprising:
    moving a vehicle along a track;
    reading and recording position information from a plurality of positioning tags on or adjacent to the track at a plurality of predetermined positions along the track;
    monitoring an environmental parameter, using a monitoring device mounted to the vehicle;
    recording the monitored environmental parameter along the track as a plurality of data points;
    associating each data point of the plurality of data points with a time tag of a plurality of time tags;
    associating the position information with corresponding one or more time tags of the plurality of time tags, wherein a number of time tags associated with the position information is less than a number of time tags associated with the monitored environmental parameter; and
    displaying a visualized presentation of the recorded monitored environmental parameter and the recorded position information.

14. The method of claim 13, wherein monitoring the environmental parameter comprises monitoring one or more of vibration, temperature, humidity, a contamination level, noise, or a bio-hazardous particle level.

15. The method of claim 13, wherein displaying the visualized presentation of the recorded monitored environmental parameter and the recorded position information comprises:
    depicting a layout of the track on a display device;
    selecting at least one data point of the plurality of data points in the recorded monitored environmental parameter;
    selecting a position on the layout of the track according to the recorded position information and the selected at least one data point; and
    identifying the position on the layout of the track on the display device.

16. The method of claim 15, wherein selecting the at least one data point of the plurality of data points in the recorded monitored environmental parameter is based on a threshold value.

17. The method of claim 15, wherein selecting the at least one data point of the plurality of data points in the recorded monitored environmental parameter is based on two or more threshold values.

18. The method of claim 15, wherein selecting the position on the layout of the track according to the recorded position information and the selected at least one data point comprises interpolating or extrapolating from two or more values of the recorded position information to determine a position corresponding to the selected at least one data point.

19. The method of claim 15, wherein identifying the position on the layout of the track on the display device comprises displaying an abnormal occurrence identifier.

20. An Automated Material Handling System (AMHS) comprising:
    a track;
    a monitoring device; and
    a vehicle configured to carry the monitoring device and move along the track, the vehicle comprising:
        a detection device configured to read position information along the track; and
        a communication module communicatively coupled to the detection device and configured to transmit the position information to the monitoring device,
    wherein the monitoring device comprises:
    a controller communicatively coupled to the communication module of the vehicle, the controller being configured to record the position information and generate a visualized presentation of a layout of the track and at least one abnormal occurrence identifier associated with the recorded position information, wherein a position of the visualized presentation of the at least one abnormal occurrence identifier on the layout of the track is determined from the position information read by the detection device.

* * * * *